(12) United States Patent
Nakagaki et al.

(10) Patent No.: US 11,843,220 B2
(45) Date of Patent: *Dec. 12, 2023

(54) LIGHT EMITTING DEVICE AND METHOD OF MANUFACTURING LIGHT EMITTING DEVICE

(71) Applicant: NICHIA CORPORATION, Anan (JP)

(72) Inventors: Masatoshi Nakagaki, Komatsushima (JP); Kazuma Kozuru, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/718,857

(22) Filed: Apr. 12, 2022

(65) Prior Publication Data

US 2022/0239060 A1 Jul. 28, 2022

Related U.S. Application Data

(63) Continuation of application No. 16/744,004, filed on Jan. 15, 2020, now Pat. No. 11,336,075.

(30) Foreign Application Priority Data

Jan. 16, 2019 (JP) ................. 2019-005520

(51) Int. Cl.
*H01S 5/02255* (2021.01)
*H01S 5/02325* (2021.01)
*H01S 5/0236* (2021.01)

(52) U.S. Cl.
CPC ........ *H01S 5/02255* (2021.01); *H01S 5/0236* (2021.01); *H01S 5/02325* (2021.01)

(58) Field of Classification Search
CPC .............. H01S 5/02255; H01S 5/0225; H01S 5/02218; H01S 5/4031; G02B 6/4286
(Continued)

(56) References Cited

U.S. PATENT DOCUMENTS

| 5,327,443 A | 7/1994 | Tanaka et al. |
| 10,594,107 B2 | 3/2020 | Tanisaka |

(Continued)

FOREIGN PATENT DOCUMENTS

| JP | H05-129711 A | 5/1993 |
| JP | 2003-188454 A | 7/2003 |

(Continued)

OTHER PUBLICATIONS

Non-Final Office Action in U.S. Appl. No. 16/744,004 dated Sep. 13, 2021 (10 pages).

(Continued)

*Primary Examiner* — Tuan N Nguyen
(74) *Attorney, Agent, or Firm* — Foley & Lardner LLP

(57) ABSTRACT

A light emitting device includes: a first semiconductor laser element; a base portion including: a bottom portion including a first upper surface on which the first semiconductor laser element is disposed, and a frame portion surrounding the first semiconductor laser element, the frame portion including a second upper surface positioned above the first upper surface and a support portion positioned between the first upper surface and the second upper surface, the a support portion having a support area; a light reflecting member having a flat plate-shaped and contacting the support area, the light reflecting member being configured to reflect light from the first semiconductor laser element; and a lid portion bonded to the second upper surface.

13 Claims, 12 Drawing Sheets

(58) Field of Classification Search
USPC .................................................. 372/29.011
See application file for complete search history.

(56) References Cited

U.S. PATENT DOCUMENTS

| | | | |
|---|---|---|---|
| 2004/0071174 A1* | 4/2004 | Takemori | H01S 5/02216 |
| | | | 372/36 |
| 2012/0039072 A1* | 2/2012 | Lell | H01S 5/0087 |
| | | | 362/259 |
| 2013/0272329 A1* | 10/2013 | Auen | H01S 5/02216 |
| | | | 372/34 |
| 2013/0329397 A1 | 12/2013 | Shimizu et al. | |
| 2016/0285234 A1 | 9/2016 | Okahisa | |
| 2017/0122505 A1 | 5/2017 | Kiyota et al. | |
| 2019/0319431 A1 | 10/2019 | Katagiri | |

FOREIGN PATENT DOCUMENTS

| | | |
|---|---|---|
| JP | 2003-224323 A | 8/2003 |
| JP | 2004-128342 A | 4/2004 |
| JP | 2017-085036 A | 5/2017 |

OTHER PUBLICATIONS

Notice of Allowance in U.S. Appl. No. 16/744,004 dated Jan. 21, 2022 (7 pages).

* cited by examiner

1

LIGHT EMITTING DEVICE AND METHOD OF MANUFACTURING LIGHT EMITTING DEVICE

CROSS-REFERENCE TO RELATED APPLICATION

This application is a continuation of U.S. patent application Ser. No. 16/744,004, filed on Jan. 15, 2020, which is based upon and claims priority to Japanese Patent Application No. 2019-005520, filed on Jan. 16, 2019. The disclosures of these applications are hereby incorporated by reference in their entireties.

BACKGROUND

The present disclosure relates to light emitting devices and methods of manufacturing light emitting devices.

It is known to employ a light emitting device in which a light emitting element such as a LED element or a semiconductor laser element as a light source. In such a light emitting device, a light emitting element, a base portion on which the light emitting element is disposed, a lens member, and the like are packaged. (See, Japanese Patent Publication No. 2003-224323)

A light emitting device can include a light reflecting member used to extract light emitted from a light emitting element. There are several reasons for using a light reflecting member. For example, when the light emitting element is a semiconductor laser element, the light reflecting member may be used for the purpose of increasing the optical path length and improving the heat dissipation property.

SUMMARY

However, when a light reflecting member is disposed inside the package as described above, the size of the light emitting device is accordingly increased. Further, when the shape of the light reflecting member is complicated, productivity is affected. Size reduction and improvement of productivity can enhance usefulness and industrial availability of the light emitting device. Thus, there is a room for improvement in the arrangement or the shape of the light reflecting member.

According to one embodiment, a light emitting device includes: a semiconductor laser element, a base portion, and a light reflecting member. The base portion includes a bottom portion on which the semiconductor laser element is arranged. The substrate also includes a frame portion including a step and surrounding the semiconductor laser element. The light reflecting member is provided to reflect light from the semiconductor laser element. The light reflecting member is leaned against the step.

The present disclosure also provides a method of manufacturing a light emitting device. According to one embodiment, the manufacturing method includes: providing a base portion having a frame portion and bottom portion on which a semiconductor laser element is disposed, the frame portion including a step and surrounding the semiconductor laser element, providing a light reflecting member for the semiconductor laser element; and disposing the light reflecting member on the bottom portion of the base portion so as to leaning against the step of the frame portion.

Certain embodiments of the present disclosure can achieve size reduction of a light emitting device in which a light reflecting member is employed.

DETAILED DESCRIPTION

Figure 1:
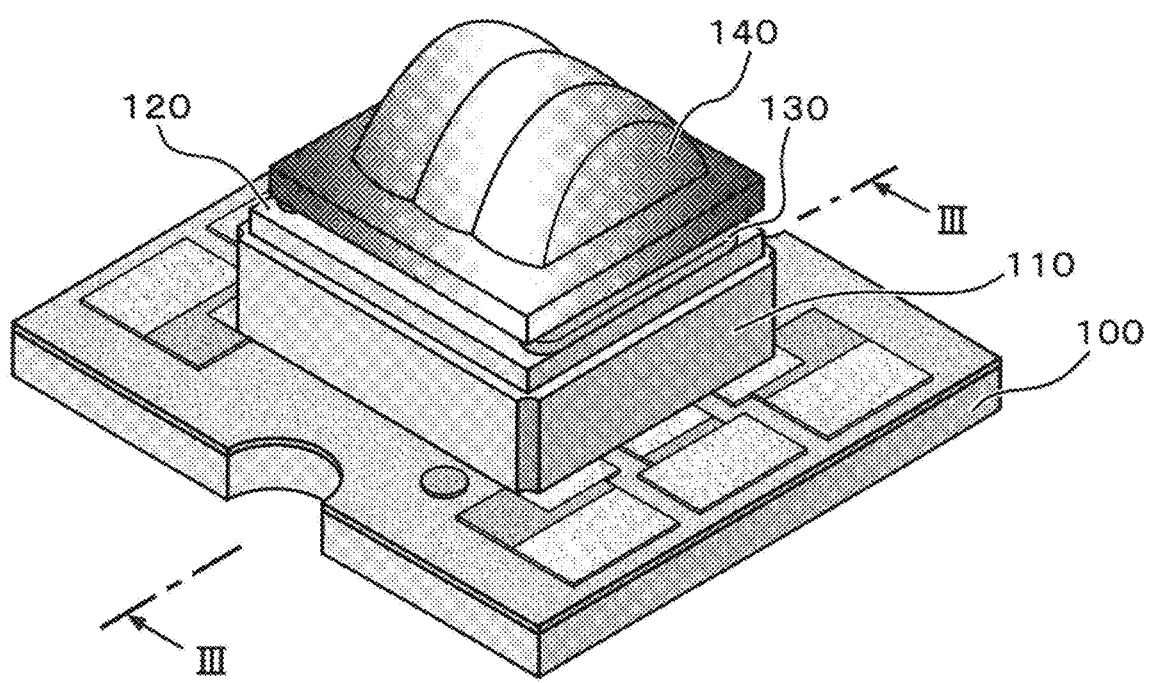
FIG. 1 is a schematic perspective diagram of a light emitting device according to certain embodiment of the present disclosure.

Hereinafter, embodiments of the present disclosure will be illustrated with reference to the accompanying drawings. It is to be noted that the embodiments shown below are intended to demonstrate the technical ideas of the present invention, but are not intended to limit the scope of the present invention. In the descriptions below, the same term or reference numeral generally represents the same member or a similar member, and its detailed description will be omitted as appropriate. The sizes, positional relations and the like of members shown in the drawings may be exaggerated for clarified explanation of the present disclosure unless specifically stated otherwise.

Figure 3:
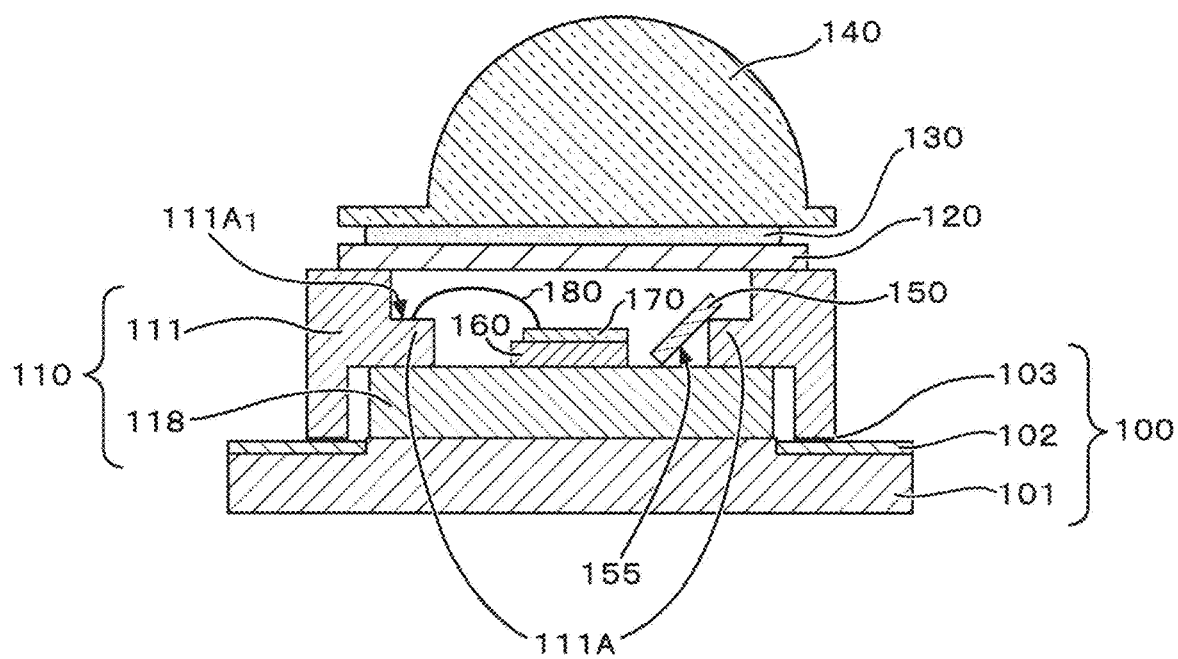
FIG. 3 is a cross-sectional diagram of the light emitting device taken along line in FIG. 1.

The term "vertical direction" as used directly or indirectly herein corresponds to the vertical direction in FIG. 3. The "vertical direction" is defined by an upper side to a lower side assuming that the lens member 140 is positioned at the upper and the substrate 100 positioned a lower side.

The term "cross-sectional view" (or "cross-sectional diagram") herein is based on an imaginary cross-section taken along the thickness of a semiconductor laser element or a light emitting device. From another point of view, a cross-section taken along a direction orthogonal to a package surface main surface on which the semiconductor laser element is arranged (specifically a main surface of a bottom portion of a package) corresponds to the "cross-sectional view" (or "cross-sectional diagram"). Further, the term "plan view" (or "top view") corresponds to an illustration of an object seen from the top along the thickness of the light emitting device.

Light Emitting Device

Figure 2:
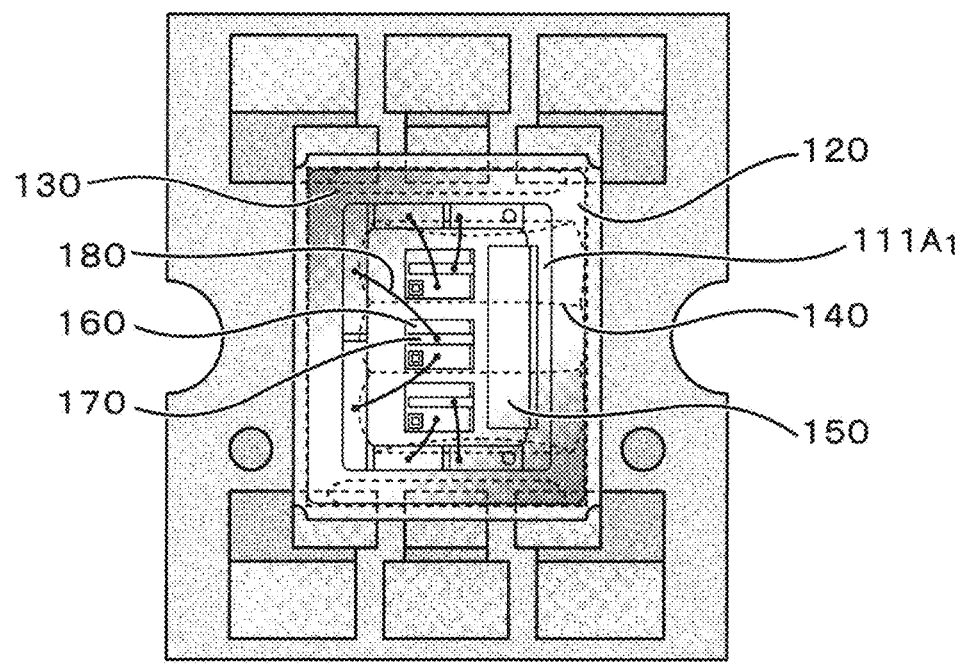
FIG. 2 is a top plan view for illustrating the internal structure of the light emitting device in FIG. 1.
Figure 4:
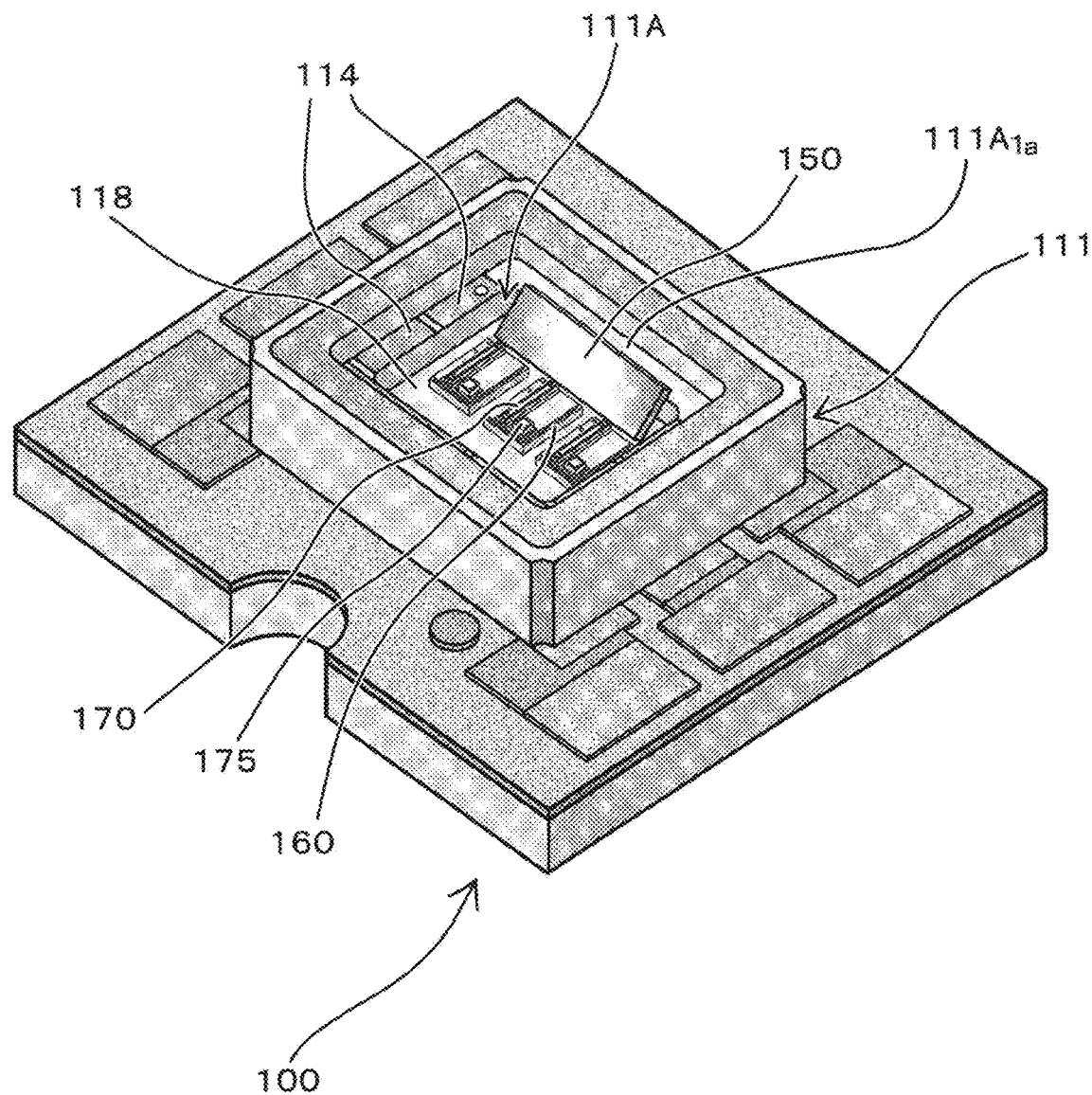
FIG. 4 is a schematic perspective diagram showing the internal structure of the light emitting device according to the embodiment of the present disclosure.

First, the general configuration of a light emitting device of certain embodiment will be described with reference to FIGS. 1 to 4. FIG. 1 is a schematic perspective diagram showing the appearance of a light emitting device 1 according to the embodiment. FIG. 2 is a top plan for illustrating the internal structure of the light emitting device 1. FIG. 3 is an arrow-direction cross-sectional diagram taken along line in FIG. 1. FIG. 4 is a perspective diagram showing the inner part of the light emitting device where upper portions such as a lens member 140 and a lid portion 120 are omitted. In FIG. 2, a lid portion 120, an adhesion portion 130 and a lens member 140 are shown by dashed lines to show the internal structure, and portions that would be visible as seeing through the above-mentioned members are shown by solid lines. Further, for avoiding complication of the drawings, a wire 180 shown in FIGS. 2 and 3 is omitted in FIG. 4.

The light emitting device 1 is a device in which light emitted from a semiconductor laser element 170 is reflected at a light reflecting surface of a light reflecting member 150, and passes through the lens member 140 to exit to the outside of the light emitting device 1. The number of semiconductor laser elements 170 is not limited to one, or can be two or more. In the light emitting device 1, light emitted from a plurality of semiconductor laser elements 170 is reflected by the light reflecting member 150, and extracted to the outside through the lens member 140. The semiconductor laser elements 170 are provided on one or more sub-mounts 160. As shown in FIG. 2, a plurality of sub-mounts 160 is arranged in such a manner that the respective semiconductor laser elements 170 emits light in the same direction. The light reflecting member 150 is disposed so as to correspond to the plurality of semiconductor laser elements 170.

The light emitting device 1 can include not only a package for emitting light, but also a mounting substrate on which the package is mounted. The light emitting device 1 can be configured to include a mounting substrate, but the present disclosure is not limited thereto, and for example, the package alone can be configured as the light emitting device 1.

The configuration of the light emitting device 1 will be described in more detail. The light emitting device 1 includes, for example, a substrate 100 as the mounting substrate, and constituent elements such as a base portion 110, the lid portion 120, the adhesion portion 130, the lens member 140, the light reflecting member 150, the sub-mount 160, the semiconductor laser element 170 and the wire 180 to form the package. In a closed space formed by bonding the base portion 110 and the lid portion 120 to each other, the light reflecting member 150, and the sub-mount 160 on which the semiconductor laser element 170 is arranged are disposed. Further, the wire 180 is provided to electrically connect the semiconductor laser element 170 disposed on the base portion 110.

Further, as shown in FIG. 3, the base portion 110 has the frame portion 111 and the bottom portion 118. As can be seen from the shown configuration, the semiconductor laser elements 170 are provided on the bottom portion 118 of the base portion 110, and the semiconductor laser elements 170 are surrounded by the frame portion 111 to form the package.

The semiconductor laser elements 170 are provided on the bottom portion 118 of the substrate 110, and the wire 180 extends from the semiconductor laser element 170 to the frame portion 111 of the base portion 110. As can be seen from FIG. 3, the frame portion 111 has a step 111A. That is, the frame portion 111 of the substrate 110 is defined with a surface $111A_1$ on which the wire 180 is connected for electrical connection, and the surface $111A_1$ is involved in formation of the step 111A.

The substrate 100 is bonded to at least one of the frame portion 111 and the bottom portion 118. Further, the frame portion 111 is bonded to the lid portion 120 on a side opposite to a surface bonded to the substrate 100. The step 111A is formed above the lower surface bonded to the substrate 100 and below the upper surface bonded to the lid portion 120. That is, the step 111A is formed between the uppermost surface and the lowermost surface of the base portion 110. Further, the lid portion 120 and the lens member 140 are bonded to each other with the adhesion portion 130 interposed therebetween.

The light emitting device will be described in detail below. The light emitting device has a base portion including a bottom portion on which one or more semiconductor laser elements are arranged, and a frame portion provided so as to surround the semiconductor laser element. The frame portion has the step 111A formed by a lateral surface crossing the bottom portion and extending upward, and an upper surface crossing this lateral surface. As shown in FIGS. 3 and 4, the light reflecting member 150 is leaned against the step 111A.

The step upper surface $111A_1$ of the step 111A, against which the light reflecting member 150 is leaned, is a surface to which the semiconductor laser element 170 can be electrically connected (see FIGS. 2 and 3). That is, in the step upper surface $111A_1$, a region on which the light reflecting member 150 is leaned is different from a region to which wire 180 is bonded for electrical connection. In the light emitting device 1, the step 111A provided for electrical connection is directly extended and utilized for installation of the light reflecting member 150 as described above. By using the step 111A for installation of the light reflecting member 150 in this way, the light reflecting member 150 can be positioned close to the frame portion 111, so that the light emitting device can be made compact.

Figure 15:
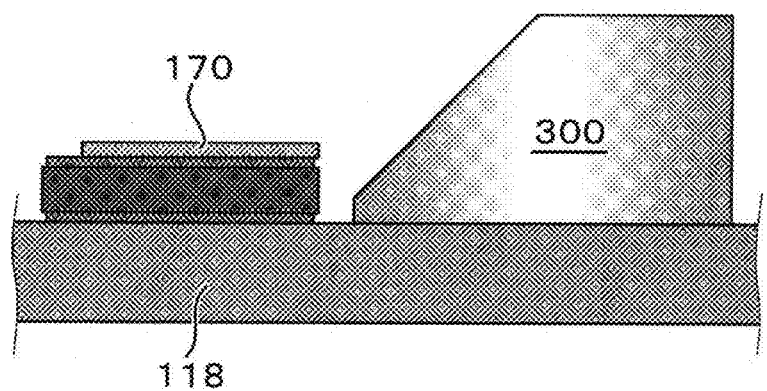
FIG. 15 is a schematic cross-sectional diagram for illustrating an aspect of a light reflecting member to be used as a target for comparison.

According to the aspect of "leaning against object", the leaning angle of the light reflecting member can be flexibly determined. For example, in the case of a light reflecting member 300 as shown in FIG. 15, it is necessary to manufacture several light reflecting members 300 each having different inclination angle to achieve the light reflection surfaces each having different inclination angles. On the other hand, in the case of the light reflecting member 150 of the embodiment, the same light reflecting member 150 can be used by adjusting the position at which the light reflecting member is leaned.

Figure 5:
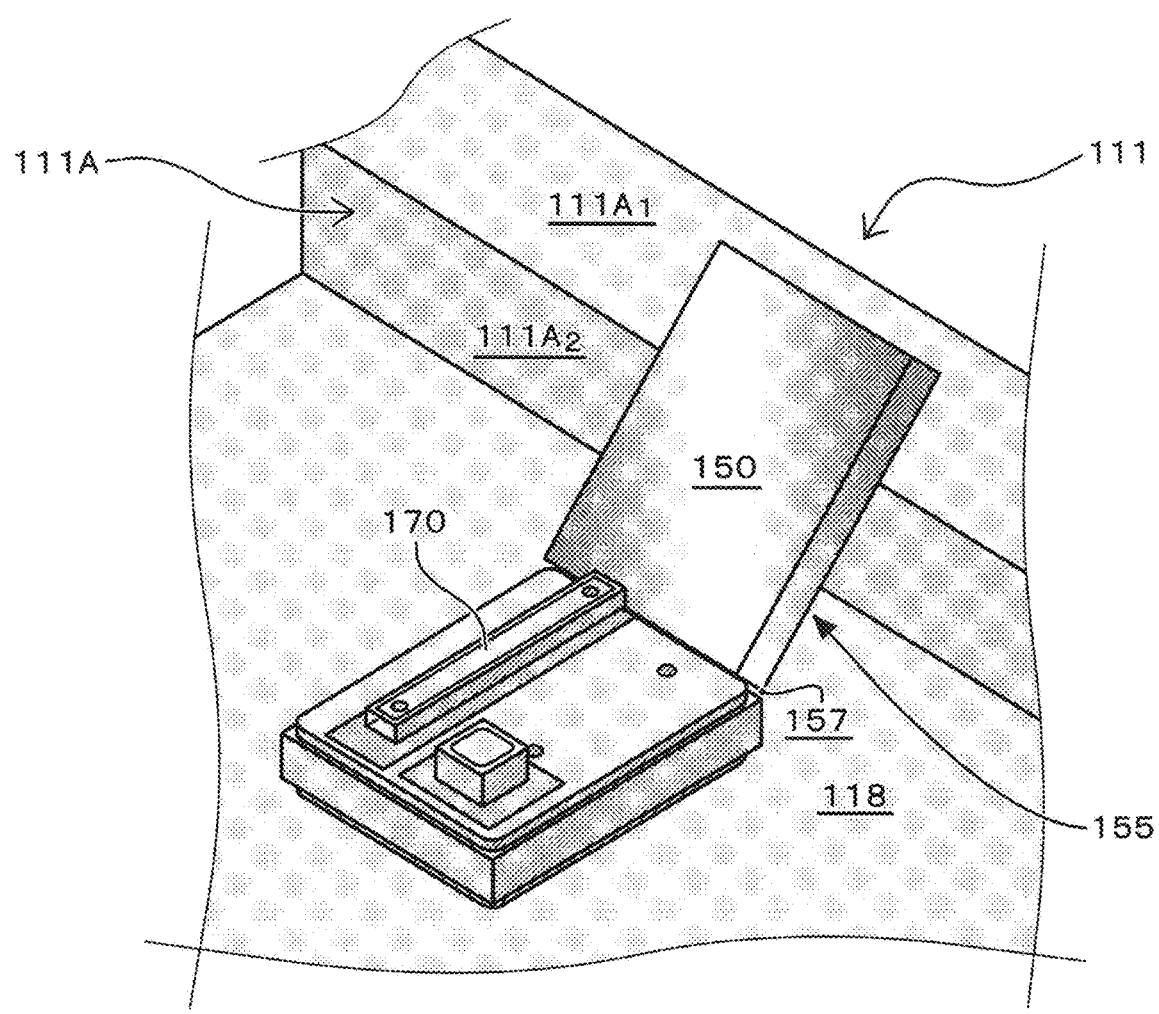
FIG. 5 is a schematic perspective diagram for illustrating the light emitting device of the present disclosure.
Figure 6:
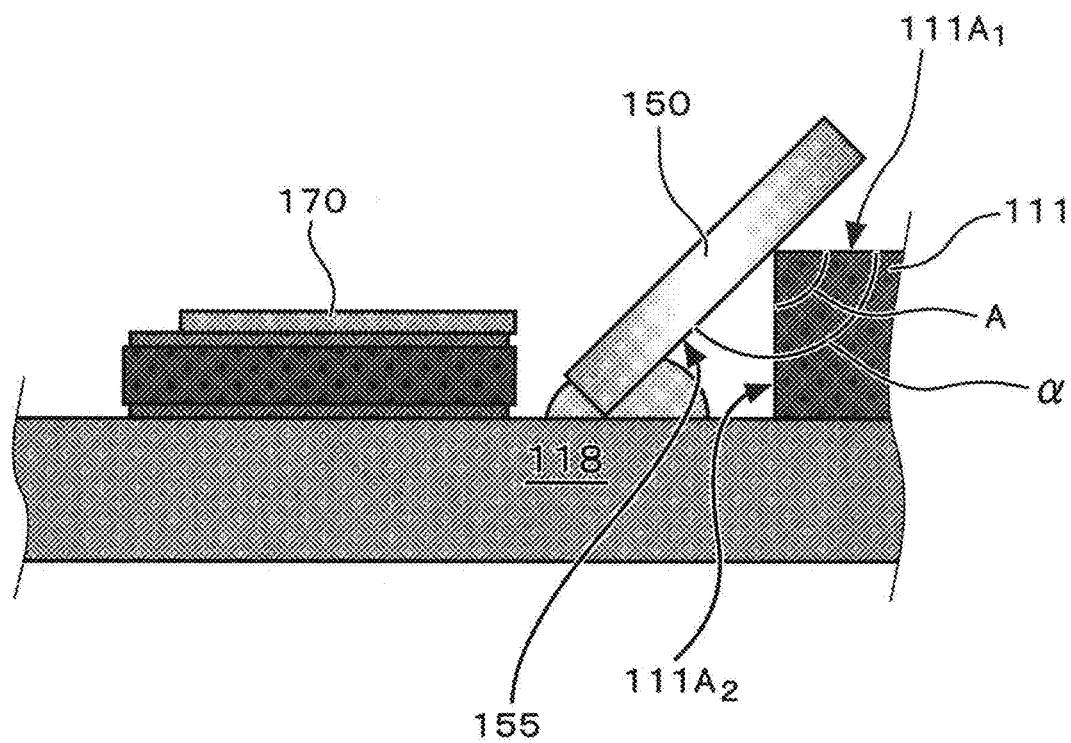
FIG. 6 is a schematic cross-sectional diagram for illustrating the features of the light emitting device of the present disclosure.

In an aspect, the light reflecting member has a flat plate shape. That is, as shown in FIGS. 5 and 6, the light reflecting member 150 has a plate-like flat shape as a whole. The light reflecting member 150 having a flat plate shape can be suitably leaned against the step of the frame portion 111.

A flat plate-shaped light reflecting member has a relatively simple shape, and is therefore easier to manufacture. The light reflecting member can be relatively easily obtained by cutting a large flat plate mirror. As compared to the light reflecting member 300 that is not leaned (see FIG. 15), the flat plate-shaped light reflecting member 150 has a smaller thickness and volume, so that material costs for the light reflecting member can be reduced. This is particularly desirable for mass production of light emitting devices, and contributes to production of light emitting devices at low costs. Therefore, productivity of light emitting devices can be improved. Further, a thin flat plate-shaped light reflecting member can contribute to weight reduction of the light emitting device. Therefore, use of a flat plate-shaped light reflecting member is advantageous in achieving size and weight reduction of the light emitting device.

The term "flat plate shape" herein means a flat shape in terms of an overall appearance in a broad sense, and means a shape in which the width dimension (one of mutually orthogonal width dimensions and/or the other width dimension) is larger than the thickness dimension by a significant degree in a narrow sense. The significant degree means, for example, satisfying the requirement that one of mutually orthogonal width dimensions and/or the other width dimension on a main surface of the light reflecting member be not less than 5 times the thickness dimension of the light reflecting member. Further, the significant degree means, for example, satisfying the requirement that the area of a plane formed by two width dimensions be not less than 5 times the area of a plane formed by one of the width dimensions and the thickness dimension. Further, the flat plate shape includes a realistic shape that can be considered to be a plate shape by those skilled in the art. The term "flat plate" as used in the flat plate shape here is flexibly interpreted, and the flat plate concept includes shapes obtained by subjecting corners of a flat plate to processing such as angle rounding, chamfering, angle cutting or round cutting. Further, the planar shape of the "flat plate" in a transverse direction is not limited to a rectangular shape as shown in the drawings, and may be a polygonal shape, and similarly, the "flat plate" concept includes shapes obtained by subjecting certain corners of a polygon to processing such as angle rounding.

The material and the configuration of the light reflecting member will be described in detail. The light reflecting member receives light emitted from the semiconductor laser element. Thus it is desirable that a material having high resistance to heat be used as a main material, and a material having a high reflectivity be used for the light reflecting surface. As the main material, glass such as quarts or BK 7 (i.e., borosilicate glass), a metal such as aluminum, Si or the like can be employed. A metal and/or a dielectric multilayer film or the like can be employed as the light reflecting surface.

In the light emitting device 1, a main surface of the light reflecting member 150 leaned serves as a bonded surface 155 with the base portion 110 as shown in FIG. 5. Specifically, in a flat plate-shaped light reflecting member, one of two opposed surfaces serves as the bonding surface 155 with the frame portion 111 and the bottom portion 118 of the base portion 110. In the light emitting device 1, an end portion 157 of the bonding surface 155 of the light reflecting member 150 is disposed at a side close to the bottom portion 118, and the light reflecting member 150 is leaned against an end portion (i.e., edge portion) of the step 111A at a position other than the end portion 157 of the bonding surface 155.

In certain aspect of the light emitting device, a region of the frame portion, which contacts the light reflecting member, is only an edge portion of the step. The term "contact" here indicates that the frame portion substantially contacts the light reflecting member. The term "substantially contact" can include a state that the frame portion and the light reflecting member are bonded so as to be adjacent to each other with a bonding agent or the like interposed therebetween. For example, when in bonding of two members, a force such as a gravity force is applied from one member to the other, the members substantially contact each other even when a bonding agent is interposed therebetween. On the other hand, for example, when one of two members is intentionally separated upward from the other member, so that a force such as a gravity force is not applied from one to the other, the two members do not substantially contact each other even when the two members are bonded with a bonding agent interposed therebetween. As can be seen from FIGS. 3 to 5, the light reflecting member 150 may be leaned against the step 111A of the frame portion 111 in such a manner that only an angulated edge portion (particularly, an edge portion angulated toward the inside of the light emitting device) contacts the light reflecting member 150 at the step 111A of the frame portion 111. In other words, the light emitting device has a structure in which the light reflecting member 150 is leaned at an end portion of the step upper surface $111A_1$ of the frame portion 111. The edge portion of the frame portion 111 that contacts the light reflecting member 150 has an angulated shape from the standpoint of appearance, and may be rounded due to the accuracy limit in manufacturing, or chamfered due to polishing for stability of shape and strength, or the like.

In certain aspect in which in the frame portion, only the edge portion of the step contacts the light reflecting member, it is easy to lean the light reflecting member at a desired leaning angle. That is, at the time of disposing the light reflecting member, influences of the shape of the frame portion, and the like are small (without excessively depending on the shape of the frame portion), and adjustment can be made so as to obtain a desired leaning angle. Thus, desired reflection of light (direction of reflected light) by the light reflecting member can be more easily achieved.

In certain embodiment, the edge portion of the step 111A is formed such that in cross-sectional view of the frame portion 111, the contour of the step 111A forms a right angle. More specifically, in cross-sectional view, the lateral surface and the upper surface of the frame portion 111, which form the edge portion, cross each other at right angle. The term "right angle" here is not limited to the exact right angle (90°), and allows for the range of 90°±1°.

In a "leaning" structure as in the light emitting device 1, the angle of the edge formed by the upper surface and the lateral surface of the step is smaller than the angle formed by the upper surface and the bonding surface of the light reflecting member. Describing with reference to the cross-sectional diagram of FIG. 6, where the angle of the edge formed by the step upper surface $111A_1$ and a step lateral surface $111A_2$ is an "angle A", and the angle formed by the step upper surface $111A_1$ and the bonding surface 155 of the light reflecting member 150 is an "angle α", the angle A and the angle α satisfy the relationship of A<α.

As can be seen from the above description and FIG. 6, the "angle of the edge formed by the upper surface and the lateral surface of the step herein means an angle of the edge formed by the upper surface and the lateral surface of the step, the angle being at the frame portion side. That is, when the angle of the edge portion formed by the upper surface and the lateral surface of the step can be broadly interpreted as that the angle may be not only the angle "A" but also the angle "360-A", but herein, the angle refers to the angle A. The phrase "angle formed by the upper surface (i.e., the upper surface forming the edge portion of the step) and the bonding surface of the light reflecting member" means an angle formed by a region of the bonding surface of the light reflecting member, which is positioned below (i.e., bottom side from) the contact point between the light reflecting member and the frame portion, and the upper surface forming the edge portion of the step. As a simple description, the angle is an "angle formed by the upper surface and the bonding surface of the light reflecting member" as viewed in a direction extending along the same direction as the angle A toward the lateral surface with reference to the upper surface.

The features of the "leaning" structure will be described from another point of view. In the embodiment, the angle formed by the bottom portion 118 and the frame portion 111 is preferably larger than the angle formed by the bottom portion 118 and the bonding surface 155 of the light reflecting member 150. As can be seen from FIG. 6, the angle formed by the bottom portion 118 and the frame portion 111 is preferably larger than 45° when the angle formed by the bottom portion 118 and the bonding surface 155 of the light reflecting member 150 is 45°.

Figure 7:
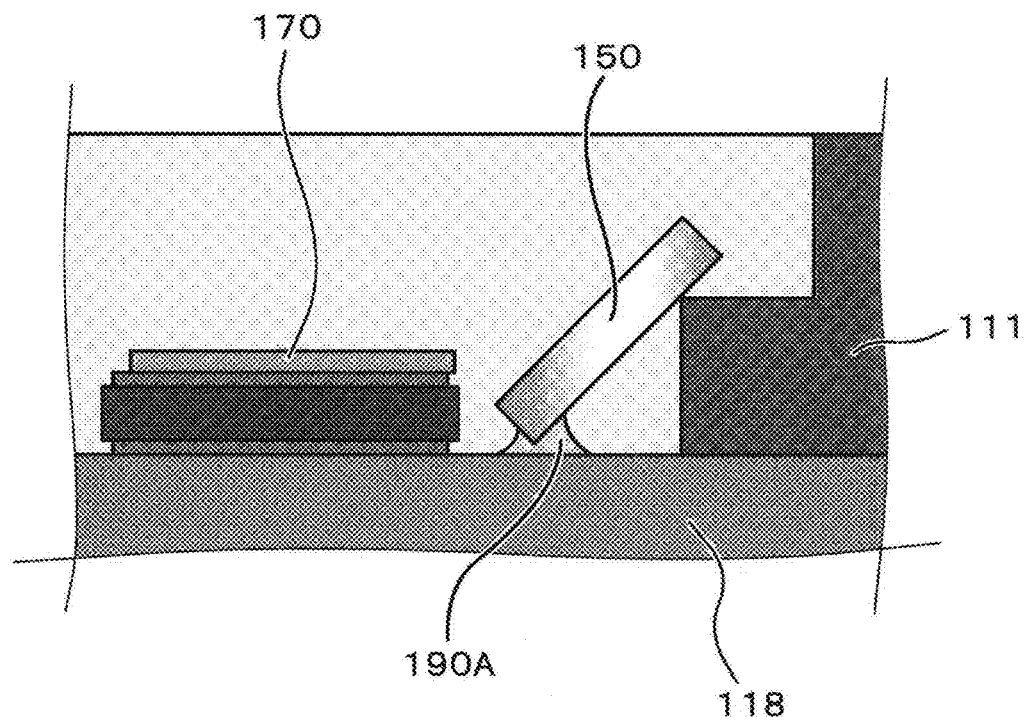
FIG. 7 is a schematic cross-sectional diagram for illustrating the features of a bonding agent disposed on a bottom portion of a base portion.
Figure 8:
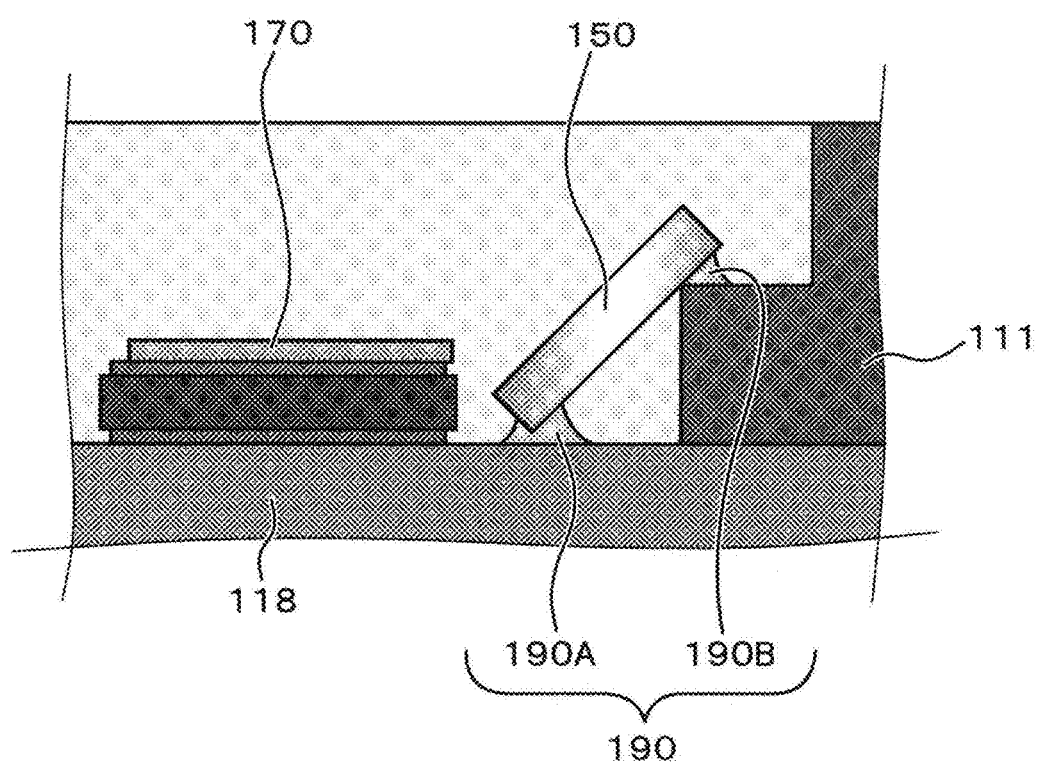
FIG. 8 is a schematic cross-sectional diagram for illustrating the features of a bonding agent disposed on a frame portion of the base portion.

In the light emitting device, the light reflecting member is bonded with a bonding agent in a state of being leaned. In certain aspect, the bottom portion 118 of the base portion 110 and the light reflecting member 150 are bonded with a bonding agent 190A as shown in FIG. 7. Using the bonding agent can allow the light reflecting member to be more stably held or fixed in a desired leaning state. In another aspect, the frame portion 111 of the base portion 110 and the light reflecting member 150 are bonded with a bonding agent 190B as shown in FIG. 8. Disposing the bonding agent also on the frame portion 111 can allow the light reflecting member to be further stably held and fixed. The bonding agent is not required to be provided along the entire length of the portion of the light reflecting member that is leaned on the edge portion of the step, but may be locally provided along the length of the light reflecting member.

The type of the bonding agent is not particularly limited. For example, the material of the bonding agent may be a resin-based material or a metal-based material. The resin-based bonding agent contains a resin as a main component, and similarly, the metal-based bonding agent contains a metal as a main component.

For the resin-based bonding agent, for example, an acryl-based bonding agent such as an acrylic ester copolymer, a silicone-based bonding agent such as silicone rubber, an epoxy resin-based bonding agent, or the like can be used. One bonding agent can be used solely, or two or more bonding agents can be used in combination.

The metal-based bonding agent contains metal particles. The material of the metal-based bonding agent can be, for example, a sintered material of metal. Such a sintered material of metal can be obtained by sintering or firing a metal paste containing metal particles, a binder resin and/or an organic solvent, and the like. The "metal" in the metal-based bonding agent refers to one that is normally recognized as a metal to those skilled in the art, and may be, for example, at least one selected from the group consisting of copper, aluminum, gold, silver, tungsten, iron, nickel and the like, or an alloy thereof. As a mere example, the metal particles in the sintered material of metal may be metal nanoparticles such as Au nanoparticles. Such a metal-based bonding agent has favorable heat resistance. Thus, even when the light reflecting member is subjected to temperature elevation by light from the semiconductor laser element (i.e. laser light), so that heat is propagated to the bonding agent, the bonding agent is less likely to degrade. In use of light of high power such as laser light, the metal-based bonding agent is preferable because it is less likely to cause dust collection. Specifically, it is possible to exhibit an effect of suppressing a phenomenon in which high-energy laser light emitted from the semiconductor laser element and organic substances present in space react with each other to form compounds at a light emitting end surface.

The binder resin that can be contained in a metal paste to be used as a raw material for the metal-based bonding agent can be any thermoplastic resin and/or any thermosetting resin as long as it contributes to more sufficient contact between metal particles and shape retention. The organic solvent that can be contained in a metal paste to be used as a raw material for the metal-based bonding agent can be any organic solvent as long as it is volatilized in sintering or firing of the paste. As a mere example, as the organic solvent, methanol, ethanol, isopropanol or the like can be used. One organic solvent may be used solely, or a mixture of two or more of these solvents may be used.

Figure 9:
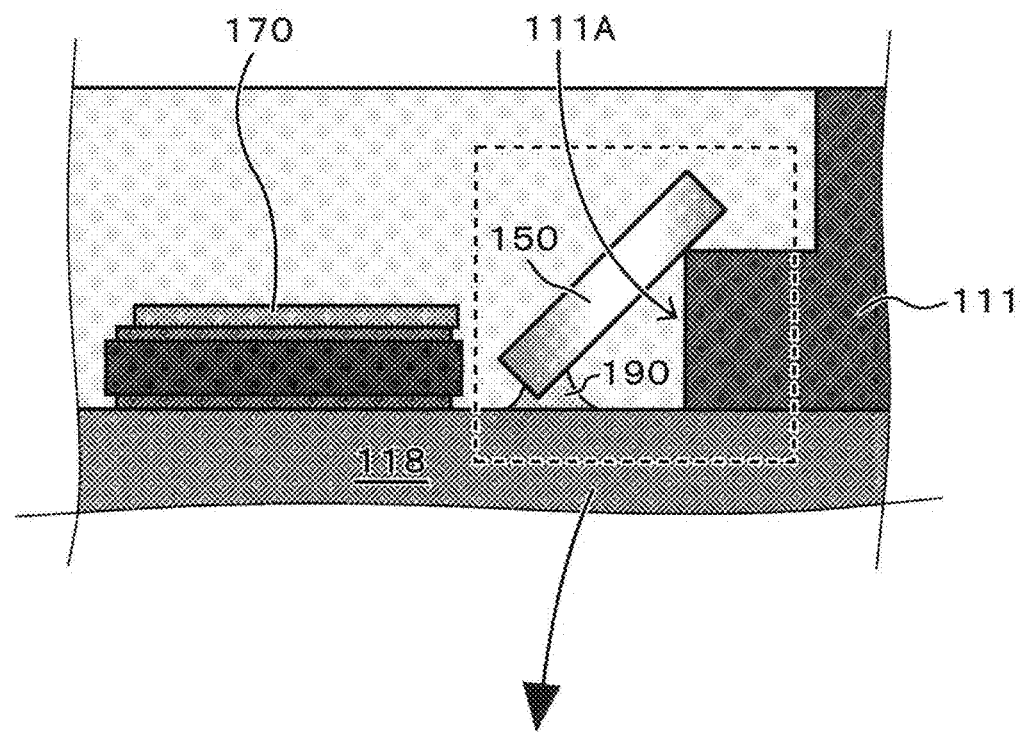
FIG. 9 is a schematic cross-sectional diagram for illustrating the features of a light reflecting member prevented from being directly contacting a bottom portion due to the interposition of the bonding agent.
Figure 9:
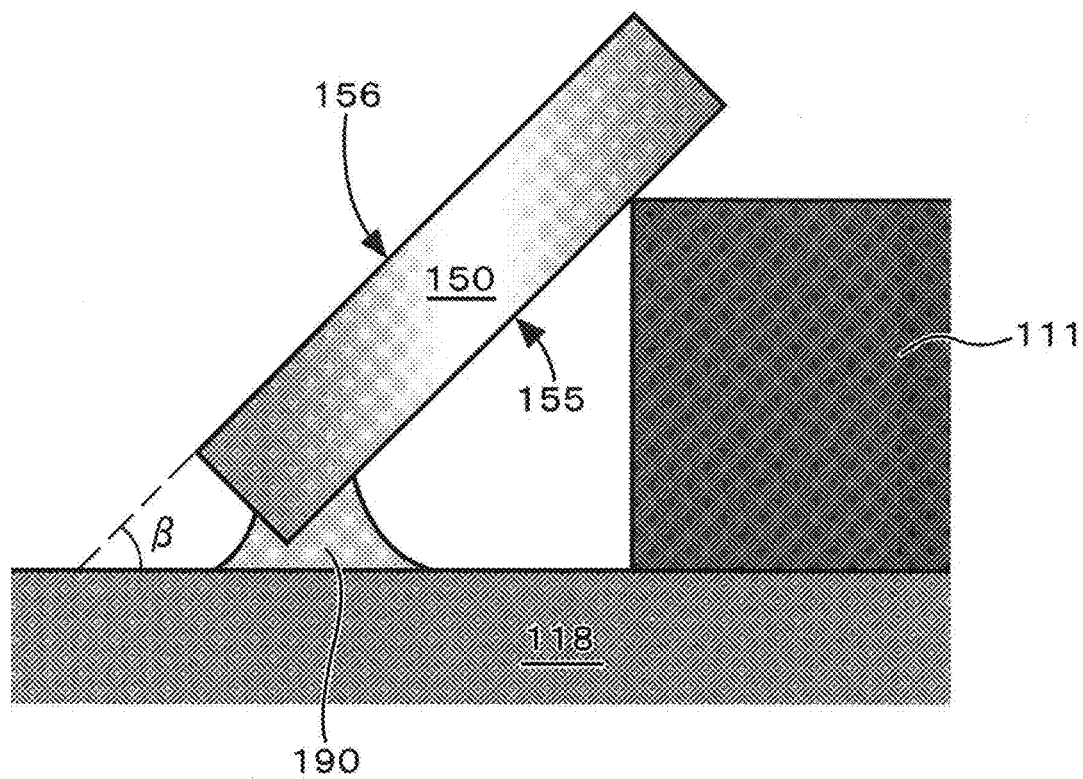

In certain aspect of the light emitting device 1, the bottom portion 118 of the base portion 110 and the light reflecting member 150 do not contact each other, and are bonded with the bonding material 190A interposed therebetween (see FIG. 9). More specifically, the light reflecting member 150 contacts the frame portion 111 of the base portion 110, and is in a state of being separated upward from the bottom portion 118 of the base portion 110, and the gap between the bottom portion 118 and the light reflecting member 150 is filled with the bonding agent 190. Such an aspect is associated with a "process of leaning a light reflecting member," described below, and related to leaning with higher accuracy.

The leaning angle is determined in such a manner that a light reflecting surface configured to reflect light from the semiconductor laser element 170 has a desired angle. In the example of the light emitting device 1, the angle is, for example, 45°. That is, it is preferable to lean the light reflecting member in such a manner that the angle formed by the light reflecting surface of the light reflecting member and the bottom portion is 45°. This can ensure that light from the semiconductor laser element can be reflected in a desired direction, and extracted. For example, by the light reflecting member leaned in such a manner that the angle formed by the light reflecting surface of the light reflecting member and the bottom portion is 45°, light from the semiconductor laser element is reflected toward the lens member, and collimated by the lens member, and the light is emitted to the outside of the light emitting device. The extracted light is not limited to collimated light, and can be collected light or diffused light.

The "angle formed by the light reflecting surface of the light reflecting member and the bottom portion" herein refers to an angle formed by the light reflecting member and the bottom portion, and specifically, the angle means an angle $\beta$ that is an acute angle, of the angles formed by the light reflecting surface 156 of the leaned light reflecting member 150 and the bottom portion 118 (refer to FIG. 9). As a simple description, the angle $\beta$ means an angle as viewed in a direction extending upward from the bottom portion 118, of the angles formed by the light reflecting surface 156 of the leaned light reflecting member 150 and the bottom portion 118. In the embodiment, the angle β formed by the light reflecting surface of the light reflecting member and the bottom portion is 45°, but does not excessively restrict to this value, and it is only necessary for light from the semiconductor laser element to travel toward the lens member as is desired. Therefore, the angle β is substantially 45° allowing for a mounting tolerance. The range of the mounting tolerance depends on component size tolerance, mounting accuracy and the like, and therefore cannot be defined without any exception, the mounting tolerance is, for example, within 5°.

Regarding the light reflecting member 150 according to the aspect shown in FIG. 9, the distance between the light reflecting member 150 and the bottom portion 118 is larger than the distance between the light reflecting member 150 and the frame portion 111, and the gap between the bottom portion 118 and the light reflecting member 150 is filled with the bonding agent 190. Specifically, where the shortest separation distance between the light reflecting member 150 and the frame portion 111 is $L_1$, and the shortest separation distance between the light reflecting member 150 and the bottom portion 118 is $L_2$, $L_1$ and $L_2$ satisfy the relationship of $L_1<L_2$. In particular, because the light reflecting member 150 and the frame portion 111 contact each other, the shortest separation distance $L_1$ between the light reflecting member 150 and the frame portion 111 is "0". The shortest separation distance $L_2$ between the light reflecting member 150 and the bottom portion 118 is not particularly limited, and is, for example, in the range of 5 μm to 100 μm. Alternatively, the shortest separation distance $L_2$ can be in the range of 10 μm to 80 μm, or in the range of 20 μm to 70 μm. Such a range of values indicates the degree of variation in value with a manufacturing method below. In other words, the light reflecting member 150 can be disposed in a state of being separated upward from the bottom portion 118 by about 5 μm to 100 μm (e.g. 10 μm to 80 μm or 20 μm to 70 μm).

In certain aspect, at least two semiconductor laser elements are provided, and one light reflecting member reflects light from the at least two semiconductor laser elements. In a specific aspect, as shown in FIG. 4, three semiconductor laser elements 170 are provided, and a single light reflecting member 150 is provided for three semiconductor laser elements 170. In such a case, the colors of light emitted from three semiconductor laser elements 170 can respectively be three colors (e.g., RGB), or light from respective three semiconductor laser elements 170 can be blue or one or more colors other than blue. Four or more semiconductor laser elements can be arranged.

Figure 10:
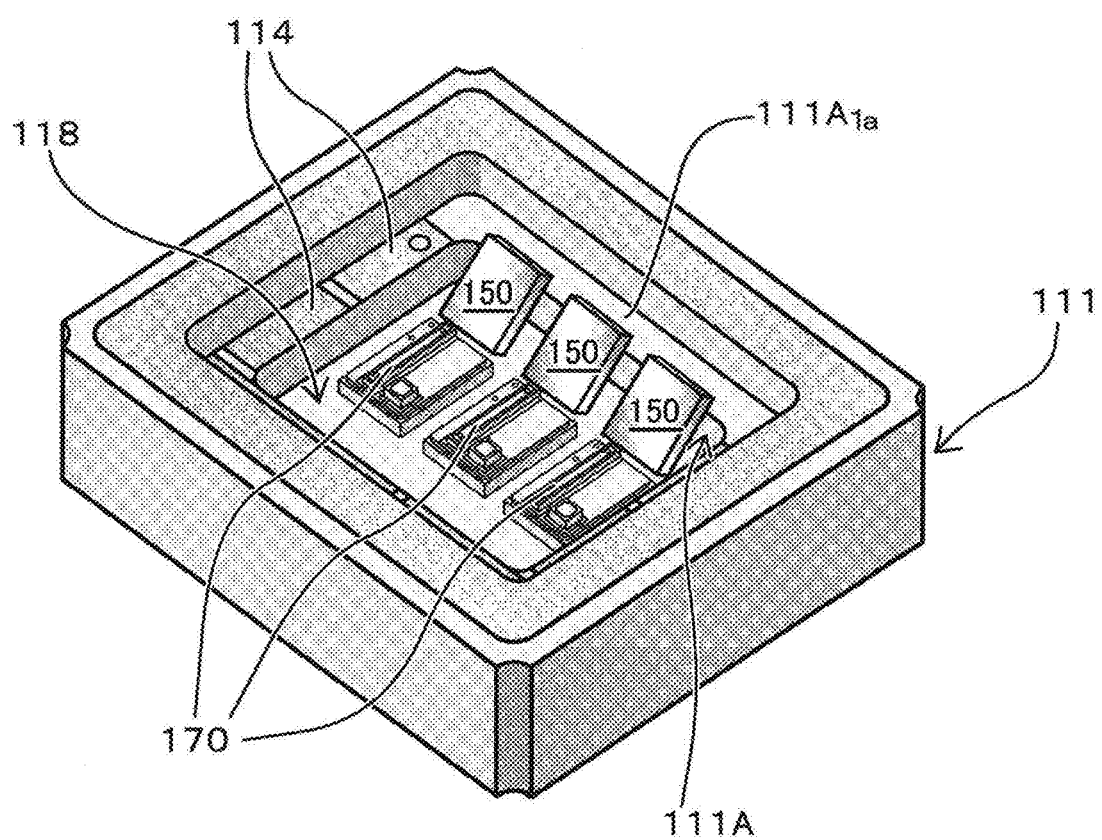
FIG. 10 is a schematic perspective diagram for illustrating the features of a light emitting device in which light reflecting members respectively correspond to semiconductor laser elements.

In another aspect, at least two semiconductor laser elements are provided, and a plurality of light reflecting members respectively reflects light from the at least two semiconductor laser elements. For example, as shown in FIG. 10, three semiconductor laser elements 170 are provided, and the light reflecting members 150 are individually provided for each of those three semiconductor laser elements 170. In such a case, light from each of the at least two semiconductor laser elements can be individually reflected in a desired direction. In the shown configuration, all of the light reflecting members 150 have the same flat plate shape (i.e., flat mirror shape), but the present disclosure is not limited thereto. For example, a plurality of light reflecting members can include flat mirrors and curved mirrors.

As described above, in the light emitting device of the embodiment, the position on which the light reflecting member 150 is leaned is the step 111A of the frame portion 111 of the base portion 110, and the upper surface of the step can also be used for electrical connection of the semiconductor laser element. Thus, at least a part of the surface forming the step includes a metal layer for electrical connection between the semiconductor laser element and the substrate (e.g., a mounting substrate such as a wiring substrate).

It is not preferable that the wire 180 extending from the semiconductor laser element runs across the light reflecting member 150 because path of light reflected at the light reflecting member may be obstructed by the wire 180. That is, it is not preferable that the wire 180 extending from the semiconductor laser element 170 runs across the light reflecting member 150 to be contributed to electrical connection to a region of the frame portion on the back side of the light reflecting member 150. Therefore, such the region of the frame portion on the back side of the light reflecting member 150 is not required to be provided with a metal layer for electrical connection between the semiconductor laser element and the substrate (e.g., a mounting substrate such as a wiring substrate). In other words, the metal layer for electrical connection to the semiconductor laser element is provide on a region of the upper surface of the step of the frame portion, which crosses a lateral surface different from a lateral surface forming an edge portion against which the light reflecting member is leaned.

The light emitting device according to the present disclosure can be implemented in various aspects. These aspects will be described in detail below.

Aspect of Base Member Installation

This aspect is an aspect in which the light emitting device includes a substrate. In particular, the light emitting device of such an aspect additionally includes a substrate as a mounting substrate (e.g. a wiring substrate), and is bonded to a package.

The substrate 100 may include, for example, a heat dissipation portion 101, an insulating portion 102 and a metal film 103 as shown in FIG. 3. The heat dissipation portion 101 is formed of a metal such as Cu. The insulating portion 102 is formed of an insulating material. The metal film 103 is formed of a metal such as Cu like the heat dissipation portion 101. The metal film 103 may be formed of a metal different from that of the heat dissipation portion 101.

The substrate 100 is bonded to the frame portion 111 and the bottom portion 118. The frame portion 111 is bonded to the substrate 100 in such a manner that the metal film 103 of the substrate 100 and a metal layer on the back surface (hereinafter, also referred to as a "back surface metal layer") of the frame portion 111 contact each other. For a bonding agent for bonding these members, solder can be used.

In the frame portion, such a back surface metal layer is preferably electrical connected to a metal layer on the upper surface (hereinafter, also referred to as a "upper surface metal layer"). For example, the back surface metal layer and the upper surface metal layer of the frame portion 111 are electrically connected to each other by an electrically conductive material extending through the inside of the frame portion (e.g. a via hole) or an electrically conductive material extending at a lateral surface of the frame portion. The upper surface metal layer is a portion where the wire 180 extending from the semiconductor laser element 170 is electrically connected, and therefore the surface metal layer can be electrically connected to the semiconductor laser element 170 and the substrate 100. The metal layer provided on the step upper surface 111A$_1$ of the light emitting device 1 corresponds to the "upper surface metal layer".

Aspect Relating to Bottom Portion and Frame Portion

This aspect is an aspect relating to a configuration of the bottom portion and the frame portion of the base portion. In the light emitting device according to the present disclosure, the bottom portion and the frame portion may be formed of the same or similar materials, and may be integrated with each other. Alternatively, the bottom portion and the frame portion may be formed of materials different from each other, and may be provided as different members, and bonded together.

When the bottom portion 118 and the frame portion 111 are different members, description is made as an aspect in which the bottom portion 118 is formed of a metallic material, and the frame portion 111 is made of a ceramic material. For example, a metal such as Cu or Al can be used for the bottom portion 118, and a ceramic such as alumina (Al$_2$O$_3$) or AlN can be used for the frame portion 111. In such a case, while strength and/or shape stability can be secured in the frame portion 111, the bottom portion 118 can have a thermal conductivity higher than that of the frame portion 111, so that the bottom portion 118 can dissipate heat well. That is, the semiconductor laser element 170 is installed on the bottom portion 118, and therefore heat can be more effectively dissipated through the bottom portion 118 from the semiconductor laser element 170.

The bottom portion 118 can have a rectangular or polygonal shape at a joined surface on which the substrate 100 is joined, and at a mounting surface on which the light reflecting member 150, the sub-mount 160 and the semiconductor laser element 170 are arranged. Further, the thickness from the joined surface and the mounting surface can be uniform. The "rectangle" here is flexibly interpreted in the present disclosure, and includes shapes obtained by subjecting corners of a rectangle plate to processing such as angle rounding, chamfering, angle cutting or round cutting. Similarly, the "polygon" here is flexibly interpreted, and includes shapes obtained by subjecting one or more of corners of a polygon to processing such as angle rounding. Further, when the corners of a rectangle or a polygon are subjected to processing, the sides of the rectangle or the polygon are considered as sides including the processed parts. The joined surface to be of the bottom portion 118 joined to the substrate 100 can be considered as a bottom surface.

The frame portion 111 can have a back surface electrode layer at a bottom surface of a surface to be bonded to the substrate 100. The back surface electrode layer includes, for example, a metal layer, and can be bonded to the metal film 103 of the substrate 100. The frame portion 111 can have an upper surface electrode layer at a surface on a side opposite to the bottom surface. That is, a upper surface electrode layer 114 electrically connected to the semiconductor laser element 170 can be provided on the upper surface of the step portion. The upper surface electrode layer and the back surface electrode layer are electrically connected to each other through, for example, a via hole. Thus, electric power can be supplied to the semiconductor laser element 170 through the upper surface electrode layer, the back surface electrode layer and the metal film 103 of the substrate 100. The frame portion 111 has a depression portion inside the back surface of the frame portion 111, and the bottom portion 118 can be accommodated in the depression portion.

The step provided in the frame portion can be formed over all four sides inside the frame in a plan view (particularly in top view), but the present disclosure is not limited thereto. The step provided in the frame portion can be formed over only two sides or three sides inside the frame in a plan view (particularly in top view). That is, the step is not required to be provided over the entire periphery of the frame, and regions to be provided with the step can be appropriately adjusted according to the number of semiconductor laser elements 170 arranged in the light emitting device 1, a combination in arrangement of a plurality of semiconductor laser elements 170, the number and positions of light reflecting members 150, and the like. For example, there are cases where it suffices that the step is provided along one side or two sides of the frame, and where the step is required to be provided over the entire periphery of the frame. The combination in arrangement of a plurality of semiconductor laser elements 170 as mentioned here refers to, for example, arrangement of a plurality of semiconductor laser elements having the same color and the same performance, or arrangement of semiconductor laser elements having different colors.

Bonding of the frame portion 111 and the bottom portion 118 can be performed, for example, by using silver brazing materials containing Ag as a main component and also containing Cu, but other metal brazing material can be used. The frame portion 111 is brought into a state in which the bottom surface to be bonded to the substrate 100 faces upward, silver brazing material is applied to the bonding surface, and the silver brazing material is melted by heating. In this state, the bottom portion 118 is set in the frame of the frame portion 111. Then, the silver solder is cooled to bond the frame portion 111 and the bottom portion 118. In this way, the base portion 110 having the frame portion 111 and the bottom portion 118 can be formed.

Aspect Relating to Semiconductor Laser Element and Peripheral Members Thereof

This aspect relates to the semiconductor laser element and peripheral members thereof.

In the light emitting device, the semiconductor laser element 170 is bonded to the sub-mount 160 provided on the bottom portion, and emits light from a lateral surface closer to the light reflecting member 150. As the material of the sub-mount 160, aluminum nitride or silicon carbide can be used. The sub-mount 160 can be provided with a metal film, and the semiconductor laser element 170 can be fixed to the sub-mount 160 with an electrically conductive layer of Au—Sn or the like. The semiconductor laser element 170 can be provided directly on the bottom portion 118 without providing the sub-mount 160.

The laser light emitted from the semiconductor laser element 170 has a far field pattern (hereinafter, referred to as "FFP") in which the length in a stacking direction of a plurality of semiconductor layers including an active layer is larger than the length in a direction perpendicular to the stacking direction on a surface parallel to the light emitting end surface. The FFP here is a shape of emitted light and or light intensity distribution of measured at a position some distance away from the light emitting end surface of the semiconductor laser element.

The light emitting device has one or more semiconductor laser elements 170. As shown in FIG. 10, for example, three semiconductor laser elements 170 can be arranged. The number of semiconductor laser elements 170 arranged is not limited thereto, and may be 1 or more. The colors of light emitted by these semiconductor laser elements 170 can be the same, or different. For example, three semiconductor laser elements 170 of the light emitting device 1 can respectively be configured as a first semiconductor laser element that emits red light, a second semiconductor laser element that emits green light, and a third semiconductor laser element that emits blue light.

The peak emission wavelength of the red light is, for example, within the range of 605 nm to 750 nm. Examples of the semiconductor laser element that emits red light include semiconductor laser elements containing an InAlGaP-based semiconductor, a GaInP-based semiconductor, a GaAs-based semiconductor or an AlGaAs-based semiconductor. The peak emission wavelength of the green light is, for example, within the range of 495 nm to 570 nm. Examples of the semiconductor laser element that emits green laser light include semiconductor laser elements containing a nitride semiconductor. The peak emission wavelength of the blue light is, for example, within the range of 420 nm to 494 nm. Examples of the semiconductor laser element that emits blue laser light include semiconductor laser elements containing a nitride semiconductor. As the nitride semiconductor, for example, GaN, InGaN and AlGaN can be used.

A wire is connected to the semiconductor laser element 170. For example, the wire is bonded to the upper surface electrode layer 114 of the frame portion 111 and the semiconductor laser element 170 to electrically connect the upper surface electrode layer 114 and the semiconductor laser element 170. The upper surface electrode layer 114 can be electrically connected to the semiconductor laser element 170, for example, by bonding one end of an Au wire to the semiconductor laser element 170 and bonding the other end of the Au wire to the upper surface electrode layer 114 using a wire bonding apparatus. A protective element 175 such as a Zener diode can be disposed on the sub-mount 160 (see FIG. 4), and in this case, the protective element 175 can also be electrically connected by the wire.

Light emitted from the semiconductor laser element 170 is reflected at the light reflecting surface of the light reflecting member 150, and passes through the lens member 140 to be extracted to the outside. The lens member 140 can have a lens shape in which a plurality of lens portions is connected as shown in FIG. 1. The lens member 140 can be designed in such a manner that one lens portion corresponds to one semiconductor laser element, and the lens portions transmit main parts of light emitted from respective semiconductor laser elements. As material of the lens member 140, for example, glass such as BK7 or B270, or the like can be used. No lens member 140 may be present.

The lens member 140 can be bonded to the lid portion 120 using an adhesive. After the bonding, the adhesion portion 130 can be formed between the lid portion 120 and the lens member 140 (see FIG. 3). Preferably, the adhesion portion 130 is not formed over the entire upper surface of the lid portion 120 or the entire lower surface of the lens member 140, but provided at a position where the adhesion portion 130 does not obstruct the path of light emitted from the semiconductor laser element 170. Specifically, in the light emitting device 1, a main part of light emitted by the semiconductor laser element 170 enters into and exits from a region having a lens shape of the lens member 140. Therefore, preferably, the adhesion portion 130 is not formed in a region of the lower surface of the lens member 140, which directly under the region having a lens shape, but formed on an outer peripheral region of the lens member 140. It is preferable to use an ultraviolet ray-curable resin is as an adhesive for forming the adhesion portion 130. The ultraviolet ray-curable resin can be cured in a relatively short time without being heated, so that the lens member 140 is easily fixed at a desired position.

Method of Manufacturing Light Emitting Device

A method of manufacturing a light emitting device according to an embodiment will now be described with reference to FIGS. 11 to 13.

Specifically, the method of manufacturing a light emitting device according to the embodiment includes: providing a base portion 118 having a frame portion 111 having a step, the frame portion 111 being surrounding a semiconductor laser element 170; providing a light reflecting member 150 for reflecting light from the semiconductor laser element 170 disposed on or above the base portion 110; providing a light reflecting member 150 on a bottom portion 118 of the base portion 110 on which the semiconductor laser element 170 is disposed so as to leaning against the step of the frame portion 111.

In the method of manufacturing a light emitting device, the base portion 110 is provided as shown in the drawings. The base portion 110 used in this step is provided on which the semiconductor laser element 170 is mounted. The base portion 110 used in this step does not have to be provided on which no semiconductor laser element 170 is mounted. That is, the semiconductor laser element 170 may be mounted after the light reflecting member 150 is bonded. Subsequently, a bonding agent 190 is provided in a predetermined region of the bottom portion 118 of the base portion 110. The light reflecting member 150 is disposed so as to be leaned against the step 111A of the frame portion 111 of the base portion 110, and the light reflecting member 150 is fixed with the bonding agent 190 to bond the light reflecting member 150 to the base portion 110.

The light reflecting member 150 to be leaned can have a flat plate shape. That is, the light reflecting member 150 can be a light reflecting member having a plate-like flat shape as a whole as described above. Such a light reflecting member is thin, and has a relatively small volume, so that it is easy to achieve reduction in size and weight of the light emitting device as described above. Such a relatively simple shape can easily be handled, can be moved in a state of being picked up, for example, by an adsorption unit such as a collet, and can contribute to suitable leaning.

Figure 11A:
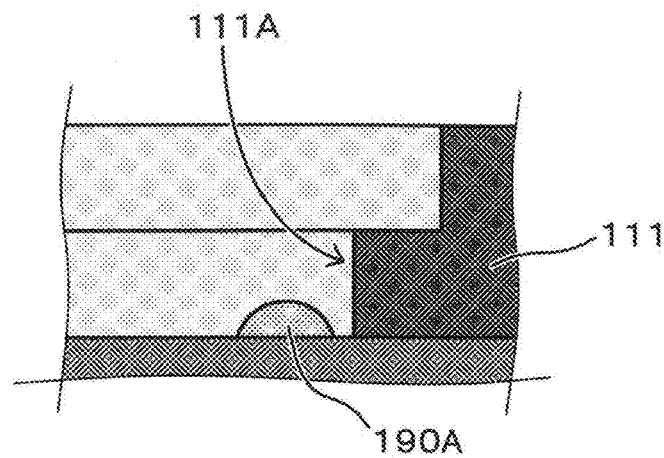
FIGS. 11A to 11C are schematic cross-sectional diagrams for illustrating the features of a manufacturing method of the present disclosure.
Figure 11B:
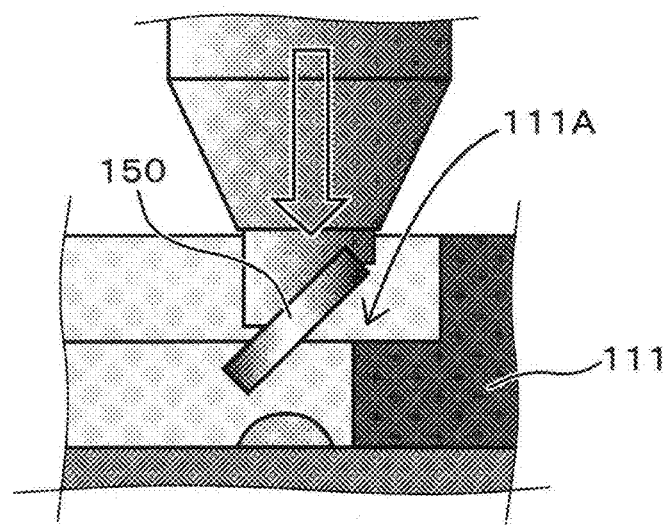
Figure 11C:
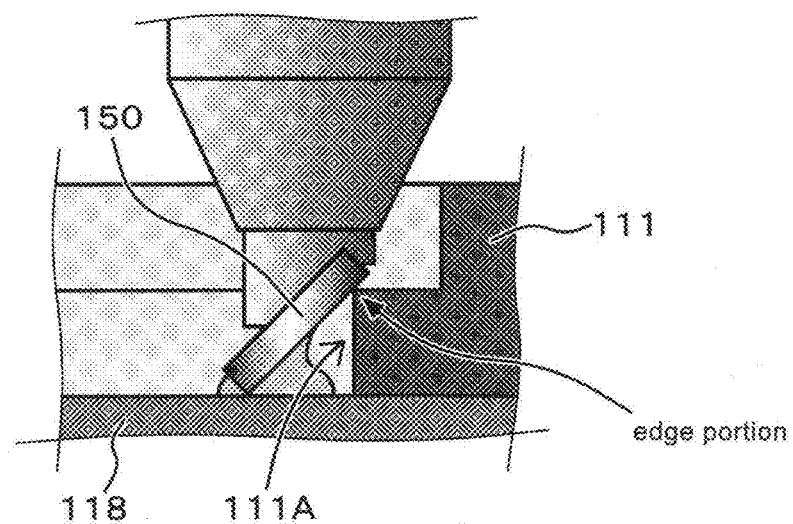

In an aspect, the light reflecting member 150 is leaned in such a manner that only an edge portion of the step 111A contacts the light reflecting member 150 at the time of bringing the light reflecting member 150 and the frame portion 111 into contact with each other (see FIGS. 11 to 13). That is, the light reflecting member 150 may be leaned against the step 111A of the frame portion 111 in such a manner that in the frame portion 111, only an angulated edge portion (particularly, an edge portion angulated toward the inside of the light emitting device) contacts the light reflecting member 150. In such an aspect, the leaning angle can be adjusted with respect to an edge portion of the step 111A, which is a contact portion between the step 111A and the light reflecting member 150, so that it is easy to dispose the light reflecting member 150 at a desired leaning angle. The operation of leaning the light reflecting member 150 can be performed, for example, from above the frame portion 111 as shown in FIGS. 11A to 11C. That is, the light reflecting member 150 is transferred downward from above the frame portion 111, and brought into contact with the edge portion of the step 111A of the frame portion 111 and the bottom portion 118, so that the light reflecting member 150 is disposed in a state of being leaned.

Figure 12A:
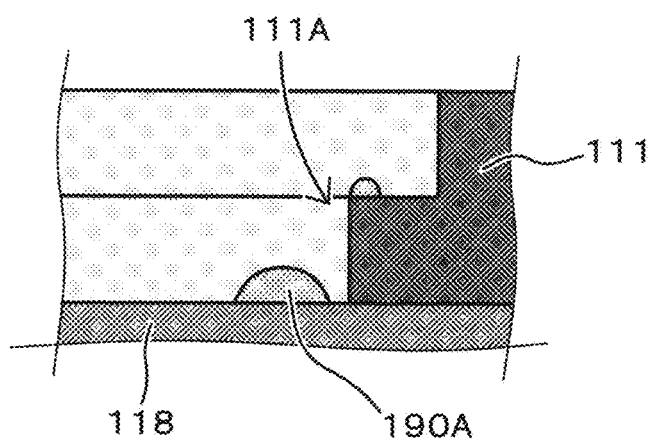
FIGS. 12A to 12C are schematic cross-sectional diagrams for illustrating the features of leaning a light reflecting member while maintaining a state in which the light reflecting member is separated upward from a bottom portion by disposing a bonding agent on the bottom portion.
Figure 12B:
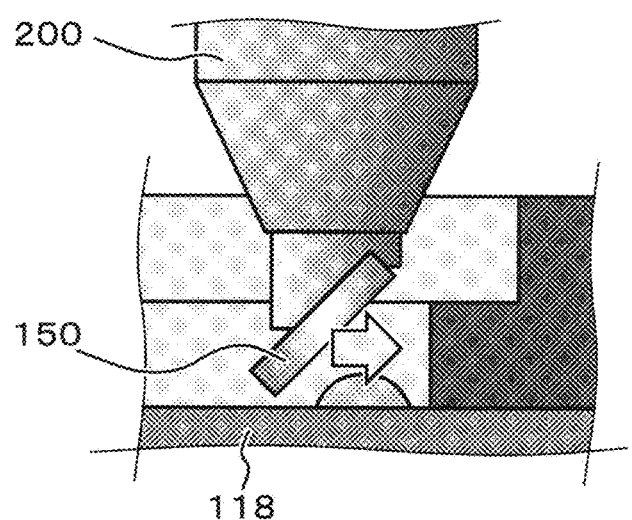
Figure 12C:
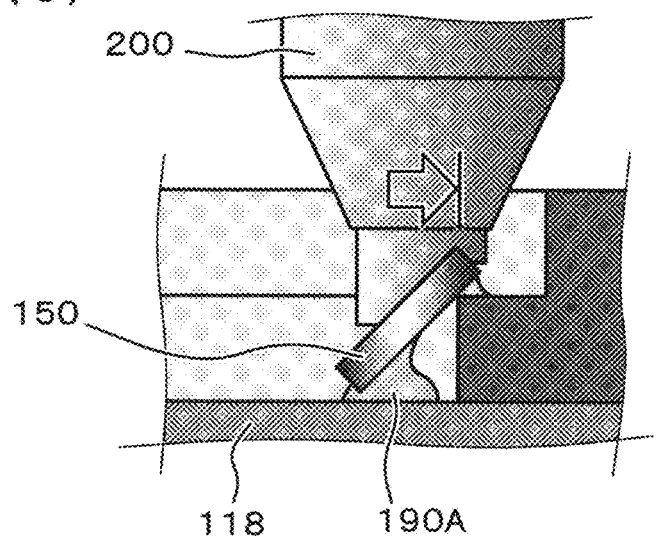
Figure 13A:
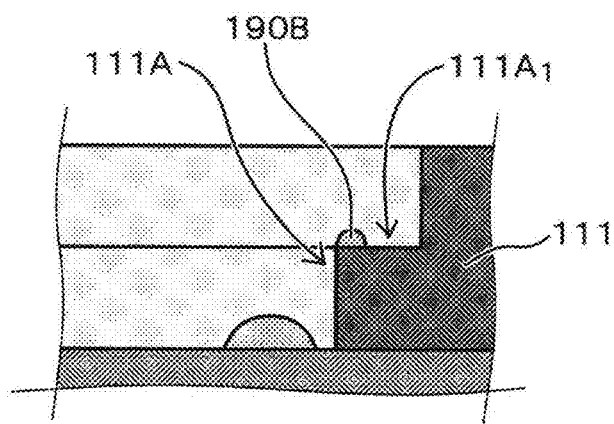
FIGS. 13A to 13C are schematic cross-sectional diagrams for illustrating the features of leaning a light reflecting member while maintaining a state in which the light reflecting member is separated upward from the bottom portion by disposing the bonding agent on a frame portion as well.
Figure 13B:
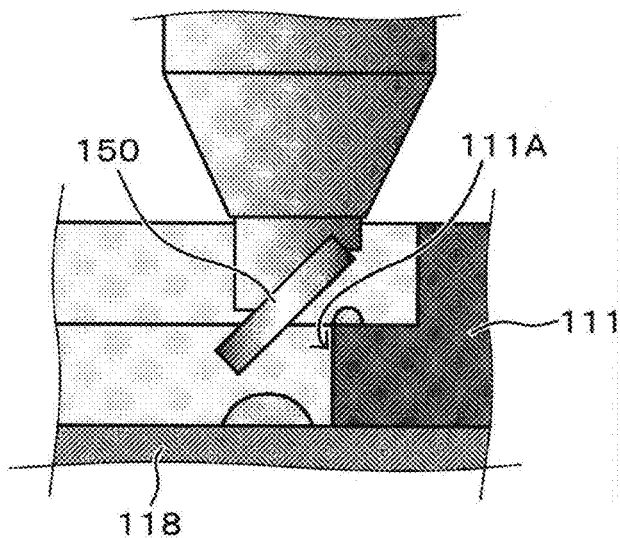
Figure 13C:
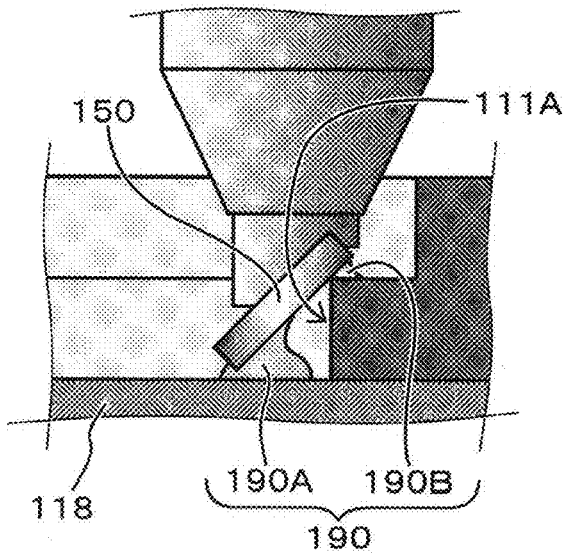

The bonding agent 190 (190A or 190B) is used for leaning the light reflecting member 150 as shown in FIGS. 11 to 13. The light reflecting member 150 can be more stably maintained in a desired state by using the bonding agent 190. For example, the light reflecting member 150 can be leaned with the bonding agent 190A disposed on the bottom portion 118 of the base portion 110 and with no bonding agent on the step 111A of the frame portion 111 as shown in FIGS. 11A to 11C and FIGS. 12A to 12C. Preferably, the bonding agent 190A provided on the bottom portion 118 is disposed on the main surface of the bottom portion 118, specifically in a region between the sub-mount and the frame portion. The light reflecting member 150 can be leaned against the step 111A of the frame portion 111 with the bonding agent 190B disposed on the frame portion 111 of the base portion 110 instead of or in addition to disposing the bonding agent 190A on the bottom portion 118 of the base portion 110 (see FIGS. 13A to 13C). The bonding agent 190B provided on the frame portion 111 is disposed specifically on the step upper surface 111A$_1$ of the frame portion 111, preferably on or vicinity of the edge. For example, it is preferable that, between a side forming the edge and a side opposed to the side on the step upper surface 111A$_1$, the bonding agent 190B is disposed on the edge side from the midpoint of the shortest distance between these two sides. Further, it is preferable that the bonding agent 190B is not disposed in a region extending in a direction away from the edge through the midpoint. When the bonding area with the bonding agent 190B is too large, stress from the frame portion 111 may increase, leading to deformation and delamination of the light reflecting member 150. At the time of leaning the light reflecting member 150, an absorption unit such as a collet 200 can be used as shown in the drawings. That is, a transfer tool utilizing vacuum action or decompression action can be used for the operation of leaning the light reflecting member. Although examples of specific types of the bonding agent have been described above, a bonding agent to be used for bonding the frame portion 111 and the lid portion 120 can be conveniently used.

Besides a method in which the light reflecting member is transferred downward from above, and brought into contact with the frame portion and the bottom portion as in FIG. 11, the light reflecting member 150 can be leaned in a state of being separated from the bottom portion 118 as shown in FIGS. 12 and 13. By separating the light reflecting member 150 from the bottom portion 118, the light reflecting member 150 is disposed on the upper side as compared to the case where the light reflecting member 150 is brought into contact with the bottom portion 118, but an angle in leaning can easily be maintained. For example, when the light reflecting member 150 is transferred downward to a predetermined position and brought into contact with the bottom portion 118 in such a manner that a constant distance is maintained between the light reflecting member 150 and the semiconductor laser element 170, the angle of the light reflecting member 150 varies under the influence of component size tolerance and mounting tolerance in the bottom portion 118 and the frame portion 111. Thus, with the influence of tolerance taken into account, the light reflecting member is leaned against the frame portion while the angle of the light reflecting surface is preliminarily maintained with a distance provided so that the light reflecting member 150 is not brought into contact with the bottom portion 118. This can improve accuracy of angle of the light reflecting member 150. The light reflecting member 150 and the bottom portion 118 can be bonded by filling the gap between the light reflecting member 150 and the bottom portion 118 with the bonding agent 190A.

It is preferable to dispose the bonding agent on the base portion 110 prior to disposing the leaning light reflecting member 150 separated from the bottom portion 118 as described above. This can facilitate stable placement of the light reflecting member at a desired leaning angle. For example, placement of the leaning light reflecting member 150 can be performed by pressing the light reflecting member 150 against the bonding agent 190A disposed on the bottom portion 118 while maintaining a state in which the light reflecting member 150 is separated from the bottom portion 118 as shown in FIGS. 12A to 12C. The bonding agent 190B can preliminarily be disposed on the frame portion 111. In such a case, the light reflecting member 150 can be disposed by pressing the light reflecting member 150 against the bonding agent 190B disposed on the frame portion 111 while maintaining a state in which the light reflecting member 150 is separated from the bottom portion 118 (see FIGS. 13A to 13C). The collet 200 can be used for maintaining a state in which the light reflecting member 150 is separated from the bottom portion 118 as shown in FIGS. 12 and 13. As can be seen from the drawing, use of the collet 200 can facilitate the light reflecting member 150 to preliminarily be inclined at a leaning-on angle or an angle close to the leaning-on angle, and the light reflecting member 150 can be proceeded to a bonding step in this state.

When the bonding agent is preliminarily disposed, the light reflecting member is pressed against the bonding agent while moving, and therefore the bonding agent tends to finally have a shape, for example, an extended shape or squashed shape in a predetermined direction. When the light reflecting member is moved in a horizontal direction for placement as shown in FIGS. 12 and 13, the bonding agents 190A and 190B tend to respectively have a shape in which the end portion is stretched or squashed outward (i.e., toward the frame portion). Such a shape can lead to an increase in area of the bonding surface between the light reflecting member and the bonding agent, so that it is possible to contribute to stable fixation of the leaned light reflecting member.

It is preferable to lean the light reflecting member in such a manner that the angle formed by the light reflecting surface of the light reflecting member and the bottom portion is 45° as described above. This means that the angle formed by the light reflecting surface of the light reflecting member and the bottom portion is preferably 45° in the finally-obtained light emitting device. In this connection, the light reflecting member can be leaned, for example, with consideration of a time-dependent change of the bonding agent. When for example, a sintering agent is used as the bonding agent, the amount of volumetric shrinkage of the bonding agent, which is associated with the sintering treatment of the bonding agent, can preliminarily be taken into account. In this case, for example, the leaning light reflecting member is disposed by pressing the light reflecting member against a metal paste containing a metal particles and a binder resin and/or an organic solvent or the like. Such a metal paste is subjected to sintering after placement of the light reflecting member, but in the sintering treatment of the metal paste, the leaning angle of the light reflecting member may be changed due to a change such as volumetric shrinkage of the metal paste. Thus, the light reflecting member can preliminarily be leaned against the bonding agent before sintering with the amount of the volumetric shrinkage taken into account.

In the manufacturing method of the embodiment, the light reflecting member 150 is leaned, and the object against which the light reflecting member is leaned is preferably a step of the "frame portion of the base portion", which contributed to electrical connection of the semiconductor laser element. The step 111A (particularly the step upper surface) of the frame portion 111 has an upper surface metal layer 114 for electrical connection to the semiconductor laser element 170, and the light reflecting member 150 can be leaned against the step 111A of the frame portion 111 including such an upper surface metal layer 114 (see FIG. 4).

It is not required to dispose a metal layer in a region of the frame portion against which the light reflecting member 150 is leaned. This is because when a metal layer is provided in such a region, and a wire 180 extending from the semiconductor laser element is connected to the metal layer, light reflected at the light reflecting member may be obstructed by the wire 180. When a metal paste is used as the bonding agent, it is preferable to use a metal material such as a metal layer for the frame portion from the viewpoint of contact between the bonding agent and the frame portion. Therefore, the "metal layer that is not required to be provided in a region of the frame portion against which the light reflecting member is leaned" refers to a metal layer that contributes to electrical connection between the semiconductor laser element and the substrate (particularly, a metal layer associated directly with an extending structure in which a wire for such connection runs across the light reflecting member).

For this reason, a part of step upper surface of the frame portion 111, which forms an edge portion, is provided with the metal layer 114 for electrical connection of the semiconductor laser element 170. Also in the manufacturing method of the embodiment, it is preferable to lean the light reflecting member 150 against the step 111A having an upper surface region $111A_{1a}$ different from the region of the step upper surface provided with the metal layer 114 (see FIGS. 4 and 10). The edge portion against which the light reflecting member 150 is leaned, in other words, the contact region with the light reflecting member 150 is an insulating region.

More detailed descriptions or other descriptions such as further specific aspects of the manufacturing method of the embodiment are not described because they have been described in the section "Light emitting device" above.

Light emitting devices according to embodiments have been described above, but they are merely shown as typical examples. Therefore, the light emitting devices for implementing the technical ideas of the embodiments are not limited to these examples, and various aspects are conceivable.

Figure 14:
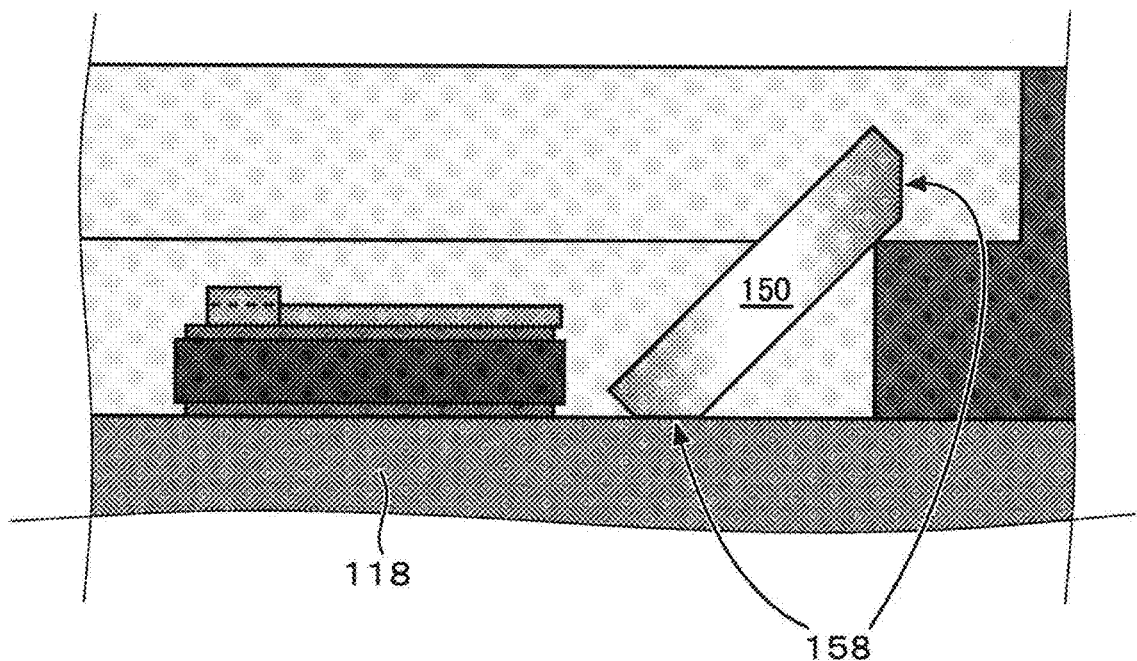
FIG. 14 is a schematic cross-sectional diagram for illustrating a modification with regard to the shape of the light reflecting member.

For example, in the aspects described above, all the edges of the flat-plate light reflecting member are angulated, but the embodiments are not limited thereto. For example, the edge 158 of the bonding surface of the light reflecting member 150 can be chamfered as shown in FIG. 14. In such a case, the light reflecting member 150 can be leaned in such a manner that the planar region after chamfering the edge contacts the bottom portion 118 of the base portion 110. Chamfering the edges 158 at both ends can facilitate mounting the light reflecting member because the mounting can be performed regardless of which chamfered region is positioned on a side close to the bottom portion 118.

Further, in the drawings referred to in the above description, the end portion of the leaned light reflecting member on the lower side is separated from the sub-mount, but the embodiments are not limited thereto. The light reflecting member can be leaned against the step of the frame portion in such a manner that the end portion of the leaned light reflecting member on the lower side contacts the sub-mount.

Finally, it should be noted, additionally, that the light emitting device and the manufacturing method having the technical features disclosed in the present disclosure are not limited to the above-described structures and manufacturing steps. For example, the present disclosure is applicable even to a light emitting device having a constituent element that is not present in the above-described light emitting device, and it cannot be said that the present disclosure is not applicable to a light emitting device because there is a difference between the light emitting device and the disclosed light emitting device. On the other hand, a light emitting device to which the present disclosure is applicable is not absolutely required to necessarily and sufficiently include all the constituent elements of the above-described light emitting device. For example, if some of the constituent elements of the above-described light emitting device are not described in claims, it is recognized that those constituent elements are not limited to those disclosed above, and are based on the degree of freedom of design by those skilled in the art, such as substitution, omission, shape modification and change of materials, and it is then claimed that inventions described in claims are applied.

The light emitting device according to the present disclosure can be used for projectors, vehicle headlights, illuminations, displays and the like.

What is claimed is:

1. A light emitting device comprising:
   a first semiconductor laser element;
   a base portion comprising:
   a bottom portion including a first upper surface on which the first semiconductor laser element is disposed, and
   a frame portion surrounding the first semiconductor laser element, the frame portion including a second upper surface positioned above the first upper surface and a support portion positioned between the first upper surface and the second upper surface, the support portion having a support area;
   a light reflecting member having a flat plate-shaped and contacting the support area, the light reflecting member being configured to reflect light from the first semiconductor laser element; and
   a lid portion bonded to the second upper surface.

2. The light emitting device according to claim 1, wherein, in a top view, an inner peripheral shape of the second upper surface is a rectangular shape, and the support area is extending along one side of the rectangular shape.

3. The light emitting device according to claim 2, wherein the frame portion is made of a ceramic material.

4. The light emitting device according to claim 2, wherein a first direction extending along the support area is perpendicular to a second direction extending along a travel direction of the light.

5. The light emitting device according to claim 4, wherein the frame portion further comprises a first wiring portion including a first wiring area positioned between the first upper surface and the second upper surface, the first wiring portion being located on opposite side of the support portion with the first upper surface interposed therebetween, the first wiring area extending in the first direction.

6. The light emitting device according to claim 5, further comprising:
   at least one wire electrically connecting the first semiconductor laser element, the at least one wire being bonded to the first wiring area.

7. The light emitting device according to claim 6, wherein the frame portion further comprises:
   one or more second wiring portions, each including a second wiring area inside the second upper surface in the top view and between the first upper surface and the second upper surface, each of the second wiring portions connecting the support portion and the first wiring portion, each of the second wiring area extending in the second direction.

8. The light emitting device according to claim 7, wherein the support area, the first wiring area, and the second wiring areas are located on the same plane parallel to the second upper surface.

9. The light emitting device according to claim 4, further comprising:
a second semiconductor laser element and a third semiconductor laser element surrounded by the frame portion;
wherein the first to third semiconductor laser element are arranged along the first direction, and the light reflecting member is configured to reflect light from the second semiconductor element and light from the third semiconductor laser element.

10. The light emitting device according to claim 9, wherein, in the first direction, a length of the light reflecting member is greater than half of a length of the first upper surface.

11. The light emitting device according to claim 1, wherein:
the frame portion has a third upper surface, a first lateral surface, and a first edge, and the third upper surface and the first lateral surface intersect at the first edge; and
the third upper surface and the first lateral surface define the support portion and the support area is included in the first edge.

12. The light emitting device according to claim 11, wherein the frame portion has a second lateral surface intersecting the second upper surface and the third upper surface.

13. The light emitting device according to claim 11, wherein the third upper surface is located above the first upper surface, and is located below the second upper surface.

* * * * *